United States Patent
Schwartz

Patent Number: 6,146,767
Date of Patent: Nov. 14, 2000

[54] SELF-ASSEMBLED ORGANIC MONOLAYERS

[75] Inventor: Jeffrey Schwartz, Princeton, N.J.

[73] Assignee: The Trustees of Princeton University, Princeton, N.J.

[21] Appl. No.: 08/794,833

[22] Filed: Feb. 4, 1997

Related U.S. Application Data

[60] Provisional application No. 60/028,949, Oct. 17, 1996, and provisional application No. 60/035,040, Jan. 13, 1997.

[51] Int. Cl.[7] .......................... B32B 15/00; B32B 15/04; B32B 15/18

[52] U.S. Cl. ....................... 428/457; 428/333; 428/450; 428/338; 428/470; 428/472; 428/472.1

[58] Field of Search .................... 428/333, 457, 428/461, 624, 463, 469, 470, 471, 472, 472.1, 688, 689, 426, 432, 450, 338

[56] References Cited

U.S. PATENT DOCUMENTS

| | | | |
|---|---|---|---|
| 3,772,355 | 11/1973 | Merz | 260/429 R |
| 4,403,941 | 9/1983 | White et al. | 431/10 |
| 4,830,993 | 5/1989 | Legrand et al. | 501/103 |
| 4,909,846 | 3/1990 | Barfurth et al. | 106/22 |
| 5,185,208 | 2/1993 | Yamashita et al. | 428/411.1 |
| 5,231,151 | 7/1993 | Spencer | 526/116 |
| 5,279,720 | 1/1994 | Divigalpitiya | 204/181.5 |
| 5,286,571 | 2/1994 | Mirkin et al. | 428/428 |
| 5,397,642 | 3/1995 | Li | 428/403 |
| 5,767,032 | 6/1998 | Hokkanen et al. | 502/108 |

FOREIGN PATENT DOCUMENTS

| | | |
|---|---|---|
| 2018463 | 1/1989 | Japan . |
| 5224448 | 9/1993 | Japan . |

OTHER PUBLICATIONS

Seto, *Stabilization of Self–Assembled Monolayers on Native Oxides* (Princeton University 1995), (May).
Gagliardi et al., *Mat. Res. Soc. Syp. Proc.*, 180, 801–805 (1990), (no month).
Laibimis et al., *Science*, 245, 845 1989), (Aug.).
Miller et al., *J. Am. Chem. Soc.*, 115, 8239–8247 (1993), (no month).

*Primary Examiner*—Deborah Jones
*Assistant Examiner*—Michael LaVilla
*Attorney, Agent, or Firm*—Synnestvedt & Lechner LLP

[57] ABSTRACT

Self-assembled organic ligand monolayers on the surface of a metal oxide or silicon oxide substrate overlayer, wherein transition metal atoms selected from Group IV, Group V or Group VI of the Periodic Chart are covalently bonded to the surface oxygens of the substrate, and each transition metal atom is further covalently bonded to one or more of the organic ligands of the monolayer, thereby covalently bonding the organic monolayer to the substrate overlayer. Methods of forming the self-assembled organic ligand monolayers of the present invention are also disclosed.

28 Claims, No Drawings

SELF-ASSEMBLED ORGANIC MONOLAYERS

CROSS REFERENCE TO RELATED APPLICATIONS

This application claims the benefit of U.S. Provisional Application No. 60/028,949 filed Oct. 17, 1996 and a U.S. Provisional Application No. 60/035,040 entitled, "Self-Assembled Organic Monolayers" filed on behalf of Jeffrey Schwartz on Jan. 13, 1997. The disclosures of both applications are incorporated herein by reference.

BACKGROUND OF THE INVENTION

The present invention relates to self-assembled organic ligand monolayers on the surface of metal oxide or silicon oxide substrates. In particular, the present invention relates to monolayers in which transition metal atoms selected from Group IVB, Group VB or Group VIB of the Periodic Chart are covalently bonded to the surface oxygen of the substrate, wherein each transition metal atom is further covalently bonded to one or more organic ligands of the monolayer, thereby bonding the organic monolayer to the surface of the substrate. In addition, the present invention relates to methods of forming such self-assembled organic ligand monolayers, by providing a metal oxide or silicon oxide substrate having a surface layer of alkoxides of transition metals selected from Group IVB, Group VB, or Group VIB of the Periodic Chart covalently bonded thereto, wherein the alkoxides are bonded at the transition metals to the surface oxygens of the substrate, and then reacting the transition metal alkoxide surface layer with an organic compound capable of reacting with transition metal alkoxides to form a covalent bond between the transition metal and a ligand of the orgasmic compound, so that organic ligands of the transition metals are formed as a self-assembled organic ligand monolayer on the surface of the substrate, covalently bonded at the transition metals to the surface oxygens of the substrate.

When assembled, organic molecular film monolayers are at the center of much current research. There are applications for self-assembled monolayer (SAM) films in fields such as microelectronic packaging, lubrication, catalysis and electrochemical applications.

To date, SAM's are formed by the absorption and spontaneous organization of amphiphilic molecules on a metal or metal oxide substrate. Typically, SAM's are formed from a solution of the amphiphilic material in which the substrate surface is immersed over a period of time during which a film is formed. When the substrate is removed from solution, the absorbed film is retained on the substrate surface.

The characterization of SAM films has revealed that there is a high degree of order, but the films have not attained the same degree of structure that Langmuir-Blodgett (LB) films exhibit. LB film structure is characterized by tightly packed molecules oriented at a consistent bond angle to the surface normal. This is attributable to the formation of LB films on smooth, even surfaces that allow the molecules to pack in the closest arrangements allowed by the size of the head/tail groups. The film coverage of the surface is even and uniform.

In the formation of SAM's, the surfaces are typically rough and uneven. This reduces the density of coverage and makes the film uneven. The uneven nature of the film increases the possibility for defect and breaches in the film integrity. Although SAM monolayers have not achieved the same degree of order, they offer a distinct advantage over LB monolayers in the simplicity of their formation.

Laibinis et al., Science, 245, 845 (1989) disclosed that a substrate surface composed of alumna and gold regions, when exposed to a common solution containing alkanethiols and organic carboxylic acids forms two homogenous SAM's, an alkanethiol-gold SAM and an organic carboxylic acid-alumna SAM, independently and simultaneously. Alkanethiols are also known to form SAM's on silver. The high affinity between the alkanethiol and the gold or silver surface allows a great variety of functional groups to exist at the other end of the alkane moiety. However, no practical use has been found for the alkanethiol/gold system. Protection for gold is redundant because gold is not a very reactive metal. The system could be used an insulator in microcircuit packaging, but gold is very expensive. The use of alkanethiols and other metals or metal oxides has not proven to be practical because thiols do not absorb onto many metal oxide surfaces.

The problem of stability is preventing the widespread success of organic carboxylic acid SAM's. The absorption of organic carboxylic acids on native metal oxides has proven to be a very weak interaction. While the SAM procedure is simple, losses in film stability and reductions in surface coverage have been experienced.

In attempting to reproduce carboxylic acid SAM's made on aluminum oxides reported in the literature, the organic carboxylic acids would not absorb irreversibly onto the aluminum oxide surface. There exists the need for organic SAM's of improved stability on native metal oxides for application in areas such as microelectronic packaging coating and biological implant coatings.

SUMMARY OF THE INVENTION

This need is met by the present invention. It has now been found that alkoxides of transition metals selected from Group IVB, Group VB and Group VIB of the Periodic Chart adhere to metal oxide and silicon oxide substrate surfaces with relative ease. Such transition metal alkoxides thus may be used as an interface in the process of forming organic ligand SAM's on such substrates. The transition metals covalently bond organic ligand SAM's to the surface oxygens of the substrate, providing organic ligand SAM's of improved stability.

Therefore, in accordance with one embodiment of the present invention, there is provided a self-assembled organic ligand monolayer on the surface of a metal oxide or silicon oxide substrate overlayer, wherein transition metal atoms selected from Group IVB, Group VB or Group VIB of the Periodic Chart are covalently bonded to the surface oxygens of the substrate, and each transition metal atom is further covalently bonded to one or more of the organic ligands of the monolayer, thereby covalently bonding the organic ligands to the substrate surface. Preferred organic ligands include ligands of carboxylic acids containing between 2 and 20 carbon atoms and ligands of pi-electron delocalized compounds. Preferred pi-electron delocalized compounds include aromatic ring compounds with the preferred ligand being a phenolate. Metal oxides suitable for use with the present invention include the native oxide layers of metals and alloys, and native oxide layers of metalloids such as silicon. Single or mixed metal oxides may also be used.

While not being bound by any particular theory, it is believed that in the absence of a transition metal atom interface, organic SAM's adhere to metal oxide or silicon oxide substrates by hydrogen bonding, which is a weak interaction. The introduction of a transition metal interface makes a significant difference in the stability of the organic SAM by covalently bonding the SAM to the substrate surface.

The present invention also provides a method by which organic ligand SAM's may be covalently bonded to the surface of metal oxide or silicon oxide substrates. In accordance with this embodiment of the present invention, there is provided a method of forming a self-assembled organic ligand monolayer on the surface of a metal oxide or silicon oxide substrate, which method includes the steps of:

provide a metal oxide or silicon oxide substrate overlayer having a surface layer of alkoxides of transition metals selected from Group IVB, Group VB or Group VIB of the Periodic Chart covalently bonded thereto, wherein the alkoxides are bonded at the transition metal atoms to the surface oxygens of the substrate overlayer; and reacting the transition metal alkoxide surface layer with an organic compound capable of reacting with the transition metal alkoxide to form an organic ligand covalently bonded to the transition metal, thereby forming an organic ligand self-assembled monolayer on the surface of the substrate, covalently bonded at the transition metal atoms to the surface oxygens of the substrate.

The metal oxide or silicon oxide substrate overlayer is preferably provided with a transition metal alkoxide surface layer by reacting the substrate overlayer with a polyalkoxide of the transition metal having two or more alkoxide groups, so that the transition metal alkoxide surface layer is formed, covalently bonded to at least one surface oxygen of the substrate overlayer, and having at least one unreacted alkoxide group.

The SAM's of the present invention may be hydrolyzed to provide transition metal oxide coating layers having utility as passivating protective coatings. Therefore, in accordance with one embodiment of this aspect of the present invention, the method of forming a self-assembled organic ligand monolayer further includes the step of hydrolyzing the monolayer so that a transition metal oxide coating is formed on the substrate surface, covalently bonded to the surface oxygens of the substrate.

The transition metal oxide passivating coatings may also be formed by thermolysis of the transition metal alkoxide surface layer, without first forming an organic ligand SAM. The present invention therefore also includes an additional embodiment wherein there is provided a method of forming a transition metal oxide coating on the surface of a metal oxide or silicon oxide substrate overlayer, which method includes the steps of:

providing a metal oxide or silicon oxide substrate overlayer having a surface layer of alkoxides of transition metals selected from Group IVB, Group VB or Group VIB of the Periodic Chart covalently bonded thereto, wherein the alkoxides are bonded at the transition metal atoms to the surface oxygens of the substrate overlayer; and thermolyzing the transition metal alkoxides, so that a transition metal oxide coating is formed on the substrate surface, covalently bonded to the surface oxygens of the substrate.

The present invention thus provides a novel type of interface that enables strong adhesion between the surface of a metal oxide or silicon oxide and an organic SAM. The carboxylic acid ligand SAM's of the present invention have potential applications for structural surfaces as passivating coatings, providing paints or other passivating films with improved adhesion, or as lubricants. The SAM may undergo further oxide synthesis to provide a thermal barrier or an electroactive material for electronics applications. The pi-electron delocalized ligand SAM's of the present invention form electrically conductive layers without further treatment and have potential end uses as electroactive materials for electronics applications without further modification. Other features of the present invention will be pointed out in the following description and claims, which disclose, by way of example, the principles of the invention and the best methods which have been presently contemplated for carrying them out.

DETAILED DESCRIPTION OF THE PREFERRED EMBODIMENTS

The SAM's of the present invention are formed by reacting a metal oxide or silicon oxide substrate having a transition metal alkoxide surface layer with an organic compound capable of reacting with the transition metal alkoxide to form a covalent bond between a ligand of the organic compound and the transition metal. The transition metal is selected from Group IVB, Group VB or Group VIB of the Periodic Chart. The alkoxides of this layer are covalently bonded by the transition metal to the surface oxygens of the substrate.

By reacting organic compounds with the transition metal alkoxide layer, organic transition metal ligands are formed as a SAM on the substrate surface, covalently bonded at the transition metal to the surface oxygens of the substrate. The conditions under which the organic compounds are reacted with the transition metal alkoxide surface layer of the metal oxide or silicon oxide substrate are not critical, and may be performed at ambient temperature and pressure. For example, a substrate having a transition metal alkoxide coating may be immersed in a solution containing an excess quantity of an organic compound such as a solution of a carboxylic acid or a suitable pi-electron delocalized compound in a non-polar solvent such as iso-octane. A dilute solution concentration of the organic compound should be employed, typically between about 1.0 mM and about 100 mM. The substrate will then be removed from the solution, rinsed with the iso-octane solvent, or another non-reactive solvent, and then dried to provide a substrate having an organic SAM.

Preferably, the organic compound is deposited on the transition metal alkoxide layer of the substrate using conventional vapor deposition techniques and equipment. The strength of the vacuum to be applied will depend upon the vapor pressure of the organic compound. Compounds with low vapor pressures will require a high vacuum.

Otherwise, ambient temperatures are employed, and an excess of the organic compound should be used to ensure a complete reaction. Preferably, the transition metal alkoxide layer of the substrate should not be exposed to ambient moisture prior to being reacted.

The reaction proceeds by the transfer of a proton from the organic compound to the alkoxide of the transition metal, forming the corresponding alkanol and an organic ligand of the transition metal. Once the reaction is complete, the vacuum is maintained in order to draw off any excess of the organic compound and the alkanol byproduct.

Suitable organic compounds include, but are not limited to carboxylic acids and pi-electron delocalized compounds capable of reacting with a transition metal alkoxide to covalently bond a ligand of the compound to the transition metal. Essentially any organic carboxylic acid capable of forming a SAM on a metal oxide or silicon oxide surface is suitable for use with the present invention. The carboxylic acid may be saturated or unsaturated, branched or unbranched, substituted or unsubstituted, and may be aromatic or non-aromatic. One example of a substituted carboxylic acid is a halogen-substituted carboxylic acid, with the preferred halogen being fluorine.

The carboxylic acid may be a monocarboxylic acid, dicarboxylic acid, or an anhydride of a dicarboxylic acid. Typical carboxylic acids will contain between 2 and 20 carbon atoms (exclusive of the carbonyl carbon), and preferably will contain between 3 and 18 carbon atoms. Stearic acid is one of the preferred carboxylic acids.

A preferred class of carboxylic acids are unsaturated carboxylic acids, which, after formation of the SAM, may be polymerized to form a single self-assembled polymer monolayer. A preferred class of unsaturated carboxylic acids are the vinyl carboxylic acids such as acrylic acids, methacrylic acid, maleic acid, and the like. Halogen-substituted acrylates are preferred, particularly chlorine and fluorine, so that the resulting SAM can be fully polymerized to obtain a single self-assembled poly (vinyl chloride) or fluoropolymer monolayer coating. Cinnamic acid could also be employed, so that the resulting SAM could be fully polymerized to obtain a self-assembled polystyrene monolayer.

Essentially any pi-electron delocalized compound capable of reacting with a transition metal alkoxide to covalently bond a ligand of the ring compound to the transition metal is suitable for use with the present invention. Particularly useful compounds are pi-electron delocalized aromatic ring compounds. A particularly preferred aromatic ring compound is a phenol, which has a relatively acidic hydrogen that is readily transferred to the transition metal alkoxide to initiate a reaction that results in the formation of a transition metal phenolate. Five-membered heteroaromatic ring compounds having proton-donating ring substituents capable of reacting with the transition metal alkoxide are also desirable because of their high degree of pi-electron delocalization. Examples of such rings include furan, thiophene and pyrrole.

The metal oxide or silicon oxide substrate having a transition metal alkoxide surface layer that is reactive with the organic carboxylic acid to produce the SAM of the present invention is obtained by reacting the substrate with a transition metal polyalkoxide. Alkoxides of transition metals selected from Group IVB, Group VB and Group VIB of the Periodic Chart are suitable for use with the present invention, with Group IVB transition metals being preferred. Titanium (Ti) and Zirconium (Zr) are the preferred Group IVB transition metals, with Zr being most preferred.

Depending upon the position of the transition metal on the Periodic Chart, the transition metal alkoxide will have from two to six alkoxide groups. Preferred alkoxide groups have from 2 to 4 carbon atoms, such as ethoxide, propoxide, iso-propoxide, butoxide, iso-butoxide and tert-butoxides. Transition metal tetra-alkoxides are preferred, with the most preferred transition metal tetra-alkoxide being zirconium tetra tert-butoxide.

With Group IVB transition metal tetra-alkoxides, at least one of the alkoxide groups reacts with surface oxygens of the metal oxide or silicon oxide substrate to form covalent bonds between the surface oxygens and the transition metal. The surface oxygens are in the form of hydroxyl groups, so that this reaction also proceeds by proton transfer from the oxide surface to an alkoxide group of a transition metal, again producing an equivalent quantity of the corresponding alkanol. At least one alkoxide group does not react and remains available for reaction with organic compounds to form an organic ligand SAM covalently bonded to transition metals.

Group VB transition metals form penta-alkoxides and oxo-trialkoxides that are suitable for use with the present invention. Both types of compounds also react by proton transfer to covalently bond the transition metal to substrate oxygens and produce an equivalent quantity of an alkanol byproduct. At least one alkoxide group does not react and is available for subsequent reaction with an organic compound to form a SAM. While Group VB transition metals also form dioxo-monoalkoxides, such compounds are not suitable for use with the present invention because, after being reacted with the substrate surface, the are no remaining alkoxide groups available for reaction to form a SAM.

Group VIB transition metals form hexa-alkoxides, oxo-tetra-alkoxides and dioxo-dialkoxides that are all suitable for use with the present invention. These compounds also react by proton transfer to covalently bond the transition metal to substrate oxygens, producing an equivalent quantity of an alkanol and leaving at least one unreacted alkoxide group for subsequent reaction to form an SAM.

Advantageously, many of the transition metal alkoxides suitable for use with the present invention are commercially available. This includes the preferred zirconium tetra tert-butoxide, which may be obtained from Aldrich Chemical. However the transition metal alkoxides may also be prepared by conventional techniques by reacting a halide or oxo-halide of the selected transition metal, depending on the desired number of alkoxide groups, with the corresponding alkoxide of a metal selected from Group I or Group II of the periodic chart.

The substrate may be reacted with the transition metal alkoxide by immersion in a dilute ( 1.0 mM to 100 mM) solution of the alkoxide in a non-reactive solvent, such as a lower alkane like iso-octane, a lower di-alkyl ether or tetrahydrofuran (THF). Or, again, the reaction may also be performed by vapor deposition. In both instances, an excess of transition metal alkoxide is employed, and the reaction then performed at ambient temperature. With solvent immersion, when the reaction is complete, the transition metal alkoxide layer obtained is rinsed with a solvent such as a lower alkane like iso-octane, a lower dialkyl ether, THF, and the like, and then dried. With vapor deposition, upon completion of the reaction the vacuum should once again be maintained to remove excess transition metal alkoxide and alkanol byproduct.

As noted above, the transition metal alkoxide layer formed on the substrate preferably should not be exposed to ambient moisture before being reacted with an organic compound to form a SAM. Therefore, a particularly preferred reaction is a two-stage vapor deposition process in which the transition metal alkoxide is first vapor deposited on the substrate. When the reaction is complete, vacuum is applied to remove excess transition metal alkoxide and alkanol by-product, which is then followed by vapor deposition of the organic compound, so that the transition metal alkoxide layer on the substrate is never exposed to ambient moisture. Upon completion of the reaction with the organic compound, the vacuum is then applied to withdraw excess organic compound and alkanol byproduct.

Substrates suitable for use with the present invention include any metal or metalloid capable of forming a native oxide overlayer, and essentially any substrate capable of being provided with an oxide overlayer coating by conventional techniques. The substrate may thus be a metal, alloy or metalloid with an actual native oxide overlayer, or a metal alloy or metalloid having an oxide overlayer physically produced by well-known oxidative conditions such as exposure to air and/or moisture. A non-metal or non-metalloid substrate such as a composite material may also be employed having an oxide of a metal deposited thereon by sputtering or having a silicon oxide overlay produced by applying a sol-gel to the substrate. Metal oxides may also be deposited on a metal or metal alloy substrate by sputtering.

The metal substrates on which oxide overlayers may be physically produced may be single or mixed metal materials. The preferred single metal substrates include aluminum and iron. Indium tin oxide (ITO) is a non-native mixed metal oxide preferred for electronics end-use applications involving, for example, electrode processes. ITO is preferably applied to substrates by conventional techniques, such as sputtering. The preferred metalloid is silicon.

As noted above, the method of the present invention may be employed to prepare SAM's of polymerizable unsaturated carboxylic acids such as acrylic acid that may be subsequently polymerized to form a single self-assembled polymeric monolayer coating on the substrate. Unexpectedly, when acrylic acid and methacrylic acid are employed, the polymerization proceeds spontaneously upon exposure to air. For less reactive coatings, the polymerization can be performed by exposing the coating to conventional polymerization reagents and conditions.

The method of the present invention may also be employed to prepare passivating transition metal oxide coatings having improved substrate adhesion. Such transition metal oxide coatings are obtained by reacting the organic ligand SAM's of the present invention with a basic solution capable of hydrolyzing the transition metal ligand, such as a 0.001 N to about a 1.0 N solution of a caustic material such as NaOH, KOH, NH$_4$OH, and the like. Lewis bases capable of hydrolyzing the organic ligands may also be used. The transition metal alkoxide coatings may also be directly converted to transition metal oxide coatings, without first forming an organic ligand SAM, by thermolysis of the transition metal alkoxide coatings at temperatures above 300° K, preferably between about 400° K and about 500° K.

The following non-limiting examples set forth hereinbelow illustrate certain aspects of the present invention. They are not to be considered limiting as to the scope and nature of the present invention. In the examples which follow, all parts are by weight.

EXAMPLES

All reagents were obtained from Aldrich Chemical unless otherwise noted. Propionic acid (99+ percent), octanoic acid (99.5+ percent) and stearic acid (99.5+ percent) were used as received. Tetra(tert-butoxy) zirconium (TBZ) was distilled at $10^{-1}$ torr and 80° C. The distilled product was stored in a nitrogen dry box, in the dark, and at −40° C. until needed. Otherwise, solvents were used as purchased. Quartz crystals were obtained from Valpey Fisher, Inc. (5.5 Mhz, ¾ inch diameter, 3 micron fine polish). Aluminum wire used for the deposition of the aluminum substrates was obtained from Alfa (1 mn diameter, 99.999 percent pure).

Infrared experiments were performed in a Nicolett 730 FT-IR Spectrometer. The glancing angle attachment used, a Variable Angle Specular Reflectance Model 500, was obtained from Spectra Tech. The angle between the surface normal and the incident beam was approximately 87°. The sample was purged with nitrogen for half an hour to reduce the amount of water on the surface. 1,000 scans were needed to obtain a reasonable signal to noise ratio. All spectra obtained were ratioed against a spectrum of a clean aluminum oxide surface. The contact angles were measured at room temperature and ambient conditions on a Tantec Contact Angle Meter CAM-F1.

Quartz crystals (5.5 MHz) were cleaned before use by soaking first in concentrated, aqueous NaOH, then concentrated H$_2$SO$_4$, followed by copious rinsing with distilled water. The crystals were then oven-dried. Electrodes were vapor-deposited onto the crystals using an Edwards Coating System E306A operating at $<10^{-6}$ torr. Electrodes were prepared as 200 nm aluminum layers deposited directly onto the quartz crystals; the geometrical electrode overlap area, on the basis of planar measurement was 0.27 cm$^2$. Air was admitted into the chamber after aluminum deposition, and the quartz crystal microbalance (QCM) electrodes were further hydroxylated by being exposed to water vapor at 80° C. for four hours. Hydroxylated QCM electrodes were evacuated for approximately 15 hours and were stored in the dry box prior to use. Profilimetry, scanning electron microscopy imaging, and an optical micrograph of the oxidized QCM electrodes all showed qualitatively rough surfaces.

The quartz crystal microbalance (QCM) was driven by a home-built Clapp oscillator and powered by a Hewlett Packard 6234A Dual Output Power Supply. The frequency of the crystal was measured using a Hewlett Packard 5334B Universal Counter and a record of the frequencies was tracked using a laboratory computer. A change in the observed frequency indicated a change in the mass of the crystal. To insure that all the frequency changes were attributable to the deposition of the reactants, the frequency of the crystal was monitored before and after exposure to reactants.

Comparative Example

The reproduction of the documented formation of self-assembled monolayers on aluminum oxide in an iso-octane solution, using stearic acid was accomplished successfully. A 1 mM solution of stearic acid was prepared for deposition on fresh aluminum films. The aluminum substrates were immersed in the solution for 24 hours, then washed with fresh iso-octane. The presence of a stearic acid film was confirmed by IR spectroscopy. The self-assembled monolayer alignments were confirmed by contact angle measurements. Washing the substrates after they were immersed in the carboxylic acid solutions aided in the removal of molecules that were not bound to the aluminum, but were merely sitting on the surface.

The films formed in solution were not very stable. The stearic acid film, which formed in 24 hours, was removed by anhydrous ethyl ether under mild conditions in the same amount of time. The monolayer-coated aluminum substrate was placed in the ether at room temperature without using any stirring device. Removal of a significant portion of the film within 90 minutes was confirmed by IR spectroscopy. After removing the monolayer, it was possible to establish another monolayer on the aluminum surface by repeating the same technique. This could be done repeatedly, but there was a gradual erosion of the aluminum substrate.

From the IR information, it was apparent that the interaction between the carboxylic acid and the metal oxide substrate surface was weak, as illustrated by the ability to produce and remove the monolayer under mild conditions. The nature of the interaction is apparently hydrogen bonding between the acid and the hydroxyls on the surface of the metal. Apparently, covalent bonds are not formed because, if they were, much more vigorous conditions would be required to remove the carboxylic acid from the surface of the metal oxide.

Example 1

Preparation of Quartz Crystal Mircrobalance Electrodes

An evacuable reaction chamber equipped with two separate inlet ports was used. A QCM electrode ensemble was assembled within the chamber and connected via ports to a power supply and frequency recorder. Distilled TBZ (ca. 300 mg) was placed in a small vial attached to one port via a high-vacuum stopcock, and octanoic acid (ca. 300 mg) was placed in a second small vial attached to the other inlet port via a high-vacuum stopcock. Both were degassed by three freeze-pump thaw cycles. The assembly was isolated from the two organic reagents and was evacuated for two hours at ca. $10^{-5}$ torr. With the vessel opened to the vacuum system, the QCM was exposed to TBZ by opening the appropriate stopcock. After reaction with the electrode surface was complete as measured by the QCM, the TBZ-containing vial stopcock was closed, and the QCM-containing vessel was evacuated at ca. $10^{-5}$ torr for approximately one hour.

Following reaction of the QCM surface with TBZ, the octanoic acid-containing vial stopcock was opened and the treated QCM surface was exposed to octanoic acid vapor. After reaction with the electrode surface was complete as measured by the QCM, the QCM-containing vessel was evacuated for ca. three hours.

Pre-cleaned glass slides (VWR Scientific) were deposited with aluminum electrodes as described above for QCM crystals. The slides were then reacted with TBZ and octanoic acid as described above for QCM crystals.

Changes in QCM frequency confirmed the sequential deposition of TBZ and octanoic acid on the QCM electrode surfaces. A frequency change corresponding to loss of coating weight did not occur when the coated QCM electrode was maintained in the evacuated chamber.

IR spectroscopy confirmed the presence of a zirconium octanoate film on the surface of the aluminum oxide-coated slides. Self-assembled monolayer alignments were confirmed by contact angle measurements. IR analysis of the zirconium octanoate films showed no significant changes after two months of exposure to ambient conditions. Nor was any significant change noted in the IR spectrum of a film washed in anhydrous diethyl ether for 24 hours, as in comparative Example 1 or in $10^{-3}$ M octanoic acid in diethyl ether for ten minutes.

Comparative Example 2

A procedure similar to that described in Experimental Example 1 was performed using a single exposure of a QCM electrode ensemble to octanoic acid, without first exposing the electrode to TBZ. The QCM frequency was monitored throughout the sequence.

When the vacuum was closed, and the QCM electrode exposed to octanoic acid vapors, the initial changes in frequency indicated that an octanoic acid film had formed on the aluminum oxide surface of the electrode. When the vacuum was re-opened, however, the frequency returned to its original value and negated any significant change. Thus, if there was any type of film formed, it was adhered to the metal oxide surface by a weak force. The strength of the re-opened vacuum was able to overcome any interaction that the octanoic acid could establish with the metal oxide surface.

The QCM experiments showed convincingly that the octanoic acid was not forming stable films on the aluminum oxide surface. The addition of the TBZ to the aluminum oxide surface made a significant difference in the stability of the carboxylic acid films. The TBZ was reactive with the aluminum oxide, as shown by the large net frequency change. The reactivity of the octanoic acid was enhanced by the presence of the zirconium interfacial complex. The net changes in frequency when a zirconium interfacial complex was present was much greater than when there was a clean oxide surface, for the same period of time.

The use of a zirconium interfacial complex also made a more stable organic film than the films made by the octanoic acid alone. The octanoic acid films made on the TBZ precursor were not removed by vacuum, like the films directly formed on clean aluminum substrates.

Example 2

Deposition of Methacrylic Acid onto Zirconium/aluminum Oxide Interface

The reaction of TBZ with an oxidized aluminum-coated glass slide was performed as in experimental Example 1. The surface bound species was exposed to vapor of methacrylic acid at room temperature. IR analysis of the resulting material was taken in air. Bands associated with the tert-butoxy group were absent, and new peaks, at 2929, 2858, 1541 and 1457 $cm^{-1}$ were recorded, indicative of an alkylcarboxylate overlayer. No olefinic peaks were observed. The overlayer was, therefore, polymerized methacrylate.

Example 3

Disposition of Perfluorooctanoic Acid onto the Zirconium/aluminum Oxide Interface The reaction of TBZ with an oxidized aluminum-coated glass slide was performed as in experimental Example 1. The surface bound species was exposed to vapor of perfluorooctanoic acid at room temperature and $10^{-5}$ torr. IR analysis of the resulting material was taken in air. Bands associated with the tert-butoxy group were absent, and new peaks, at 1640, 1450 (carboxylate), 1245 and 1218 (perfluoroalkyl) $cm^{-1}$ were recorded, indicative of an alkanecarboxylate overlayer.

Example 4

Preparation of Zirconium Oxide Overlayer on Aluminum Oxide by Hydrolysis of a Zr Alkane Carboxylate or Zr Perfluoroalkane The Zr alkane carboxylate and Zr perfluoroalkane carboxylate films of Examples 2 and 3 on oxidized aluminum were exposed to 0.01 N NaOH in water. The resulting product was washed with water. Scanning electron microscopy elemental analysis showed that $ZrO_2$ had formed on the surface.

Example 5

Preparation of a Zirconium Oxide Overlayer on Aluminum Oxide by Thermolysis of Surface (Tert-butoxy) Zirconium Species The reaction of TBZ with oxided aluminum was performed at room temperature and under reduced pressure. Elemental analysis of the resulting material showed di(tert-butoxy) zirconium/oxided aluminum when the aluminum surface was previously heavily exposed to water. Elemental analysis of the resulting material showed tri(tert-butoxy)

zirconium/oxided aluminum when the aluminum surface was previously lightly exposed to water. Both classes of surface TBZ species underwent thermolysis above 300° K. IR analysis in each case showed complete loss of the tert-butoxy groups. Elemental analysis showed $ZrO_2$ remained on the surface.

Example 6

Preparation of Zirconium Alkoxide Overlayer on Indium Tin Oxide

Indium tin oxide (ITO) coatings were deposited on glass laboratory slides by conventional sputtering techniques. The reaction of TBZ with the ITO-coated glass slide was performed as in experimental Example 1. IR analysis showed the formation of di(tert-butoxy) zirconium/ITO.

Example 7

Preparation of Zirconium Carboxylate Overlayer on Indium Tin Oxide

The surface bound TBZ of the TBZ/ITO coating of Example 6 was exposed to vapor of octanoic acid as in experimental Example 1. IR analysis showed the formation of zirconium-di(octanoate)/ITO.

The results obtained in the foregoing examples indicate a general method for adsorption enhancement of organic SAM's onto any hydroxylated oxide film of a metal, alloy or metalloid capable of reaction with a transition metal alkoxide. The foregoing description of the preferred embodiments should be taken as illustrating, rather than as limiting, the present invention as defined by the claims. Numerous variations and combinations of the features described above can be utilized without departing from the present invention.

What is claimed is:

1. In a self-assembled organic ligand monolayer on the surface of a substrate having a metal oxide or silicon oxide overlayer, the improvement comprising transition metal atoms selected from the group consisting of Group IVB, Group VB and Group VIB of the Periodic Chart covalently bonded to the surface oxygens of said overlayer, wherein each transition metal is further covalently bonded to one or more organic ligands of said monolayer, thereby covalently bonding said organic monolayer to said substrate overlayer, and said organic ligands are selected from the group consisting of organic carboxylates and phenolates.

2. The monolayer of claim 1, wherein said transition metal atoms are Zr or Ti atoms.

3. The monolayer of claim 1, wherein said organic carboxylates are selected from the group consisting of monocarboxylic acid carboxylates, dicarboxylic acid carboxylates and dicarboxylic acid anhydride carboxylates.

4. The monolayer of claim 1, wherein said organic carboxylates are unsaturated.

5. The monolayer of claim 4, wherein said unsaturated organic carboxylates are polymerized.

6. The monolayer of claim 5, wherein said polymerized unsaturated organic carboxylates are halogen-substituted.

7. The monolayer of claim 1, wherein said overlayer is a native oxide of a metal, alloy or silicon substrate.

8. The monolayer of claim 1, wherein said overlayer is physically produced on a metal, alloy or silicon substrate.

9. The monolayer of claim 1, wherein said overlayer comprises a metal oxide deposited on a metal or alloy substrate by sputtering.

10. The monolayer of claim 1, wherein said overlayer is deposited on a non-metal or non-metalloid substrate.

11. The monolayer of claim 1, wherein said substrate comprises a single metal substrate of aluminum or iron.

12. The monolayer of claim 1, wherein said overlayer comprises indium tin oxide.

13. In a self-assembled organic ligand monolayer on the surface of a substrate of single metal iron having an iron oxide overlayer or a substrate having an indium tin oxide overlayer, the improvement comprising transition metal atoms selected from the group consisting of Group IVB, Group VB and Group VIB of the Periodic Chart covalently bonded to the surface oxygens of said overlayer, wherein each transition metal is further covalently bonded to one or more organic ligands of said monolayer, thereby covalently bonding said organic monolayer to said substrate overlayer.

14. The monolayer of claim 13, wherein said transition metal atoms are Zr or Ti atoms.

15. The monolayer of claim 13, wherein said organic ligands comprise organic carboxylates.

16. The monolayer of claim 15, wherein said organic carboxylates are selected from the group consisting of monocarboxylic acid carboxylates, dicarboxylic acid carboxylates and dicarboxylic acid anhydride carboxylates.

17. The monolayer of claim 15, wherein said organic carboxylates are unsaturated.

18. The monolayer of claim 17, wherein said unsaturated organic carboxylates are polymerized.

19. The monolayer of claim 18, wherein said polymerized unsaturated organic carboxylates are halogen-substituted.

20. The monolayer of claim 13, wherein said organic ligands comprise pi-electron delocalized compounds.

21. The monolayer of claim 20, wherein said pi-electron delocalized compounds are aromatic ring compounds.

22. The monolayer of claim 21, wherein said aromatic ring compounds are phenolates.

23. The monolayer of claim 13, wherein said substrate is the substrate of single metal iron having an iron oxide overlayer.

24. The monolayer of claim 23, wherein said iron oxide overlayer is a native oxide of the substrate of single metal iron.

25. The monolayer of claim 23, wherein said iron oxide overlayer is physically produced on the substrate of single metal iron.

26. The monolayer of claim 13, wherein said indium tin oxide overlayer is deposited on an alloy or metal substrate by sputtering.

27. The monolayer of claim 13, wherein said indium tin oxide overlayer is deposited on a non-metal or non-metalloid substrate.

28. The monolayer of claim 13, wherein said overlayer comprises indium tin oxide.

* * * * *

UNITED STATES PATENT AND TRADEMARK OFFICE
CERTIFICATE OF CORRECTION

PATENT NO. : 6,146,767
DATED : November 14, 2000
INVENTOR(S) : Jeffrey Schwartz

Page 1 of 1

It is certified that error appears in the above-identified patent and that said Letters Patent is hereby corrected as shown below:

<u>Column 1,</u>
Line 11, after "reference", insert the following paragraph

-- GOVERNMENT LICENSE RIGHTS --

-- The U.S. Government has a paid-up license in this invention and the right in limited circumstances to require the patent owner to license others on reasonable terms as required by the terms of Grant No. CHE-9200598 awarded by the National Science Foundation --

Signed and Sealed this

Twenty-sixth Day of March, 2002

*Attest:*

JAMES E. ROGAN
*Attesting Officer*   *Director of the United States Patent and Trademark Office*